US012027590B2

(12) United States Patent
Noguchi

(10) Patent No.: US 12,027,590 B2
(45) Date of Patent: Jul. 2, 2024

(54) SILICON CARBIDE SEMICONDUCTOR DEVICE, POWER CONVERSION DEVICE, AND MANUFACTURING METHOD OF SILICON CARBIDE SEMICONDUCTOR DEVICE

(71) Applicant: Mitsubishi Electric Corporation, Tokyo (JP)

(72) Inventor: Munetaka Noguchi, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 435 days.

(21) Appl. No.: 17/428,990

(22) PCT Filed: Sep. 27, 2019

(86) PCT No.: PCT/JP2019/038129
§ 371 (c)(1),
(2) Date: Aug. 6, 2021

(87) PCT Pub. No.: WO2020/188862
PCT Pub. Date: Sep. 24, 2020

(65) Prior Publication Data
US 2022/0085173 A1 Mar. 17, 2022

(30) Foreign Application Priority Data
Mar. 18, 2019 (JP) .................. 2019-050084

(51) Int. Cl.
*H01L 29/16* (2006.01)
*H01L 21/265* (2006.01)
(Continued)

(52) U.S. Cl.
CPC .... *H01L 29/1608* (2013.01); *H01L 21/26506* (2013.01); *H01L 21/26586* (2013.01);
(Continued)

(58) Field of Classification Search
CPC ... H01L 29/1608; H01L 29/36; H01L 29/083; H01L 29/1095; H01L 29/66068;
(Continued)

(56) References Cited

U.S. PATENT DOCUMENTS

2013/0234163 A1* 9/2013 Hamamura ....... H01L 29/66477
257/77
2014/0091324 A1 4/2014 Zushi et al.
(Continued)

FOREIGN PATENT DOCUMENTS

JP 11-274487 A 10/1999
JP 2012-54505 A 3/2012
(Continued)

OTHER PUBLICATIONS

Office Action dated Dec. 22, 2023, in Chinese Application No. 201980093714.2, 16 pages.
(Continued)

*Primary Examiner* — Marcos D. Pizarro
*Assistant Examiner* — Tiberiu Dan Onuta
(74) *Attorney, Agent, or Firm* — XSENSUS LLP

(57) ABSTRACT

A silicon carbide semiconductor device includes a drift layer of n-type formed on a semiconductor substrate composed of silicon carbide, a well region of p-type formed on a surface portion of the drift layer, a source region of p-type formed on a surface portion of the well region, a gate insulating film formed in contact with the source region, the well region, and the drift layer, and a gate electrode formed on the gate insulating film. In the silicon carbide semiconductor device, oxygen is contained in a region having a predetermined thickness from an interface between the well region and the gate insulating film toward the well regions side.

10 Claims, 18 Drawing Sheets

(51) Int. Cl.
  *H01L 29/08*   (2006.01)
  *H01L 29/10*   (2006.01)
  *H01L 29/36*   (2006.01)
  *H01L 29/66*   (2006.01)
  *H01L 29/739*  (2006.01)
  *H01L 29/78*   (2006.01)
  *H02M 1/08*    (2006.01)

(52) U.S. Cl.
  CPC ........ *H01L 29/083* (2013.01); *H01L 29/1095* (2013.01); *H01L 29/36* (2013.01); *H01L 29/66068* (2013.01); *H01L 29/7397* (2013.01); *H01L 29/7802* (2013.01); *H01L 29/7813* (2013.01); *H01L 29/7828* (2013.01); *H02M 1/08* (2013.01)

(58) Field of Classification Search
  CPC ............. H01L 29/7802; H01L 29/7813; H01L 29/7828; H01L 29/7397; H01L 21/26586; H01L 21/26506; H02M 1/08
  See application file for complete search history.

(56) References Cited

U.S. PATENT DOCUMENTS

2016/0087045 A1*  3/2016  Shimizu .............. H01L 21/324
                                                       257/77
2021/0013308 A1*  1/2021  Noguchi ............. H01L 29/1033

FOREIGN PATENT DOCUMENTS

JP    2016-63111 A     4/2016
WO    2012/153836 A1  11/2012

OTHER PUBLICATIONS

International Search Report and Written Opinion dated Nov. 5, 2019, received for PCT Application PCT/JP2019/038129, Filed on Sep. 27, 2019, 12 pages including English Translation.
Jeno et al., "Counter-Doped MOSFET's of 4H-SiC", IEEE Electron Device Letters, vol. 20, No. 12, Dec. 1999, pp. 624-626.

* cited by examiner

F I G. 1
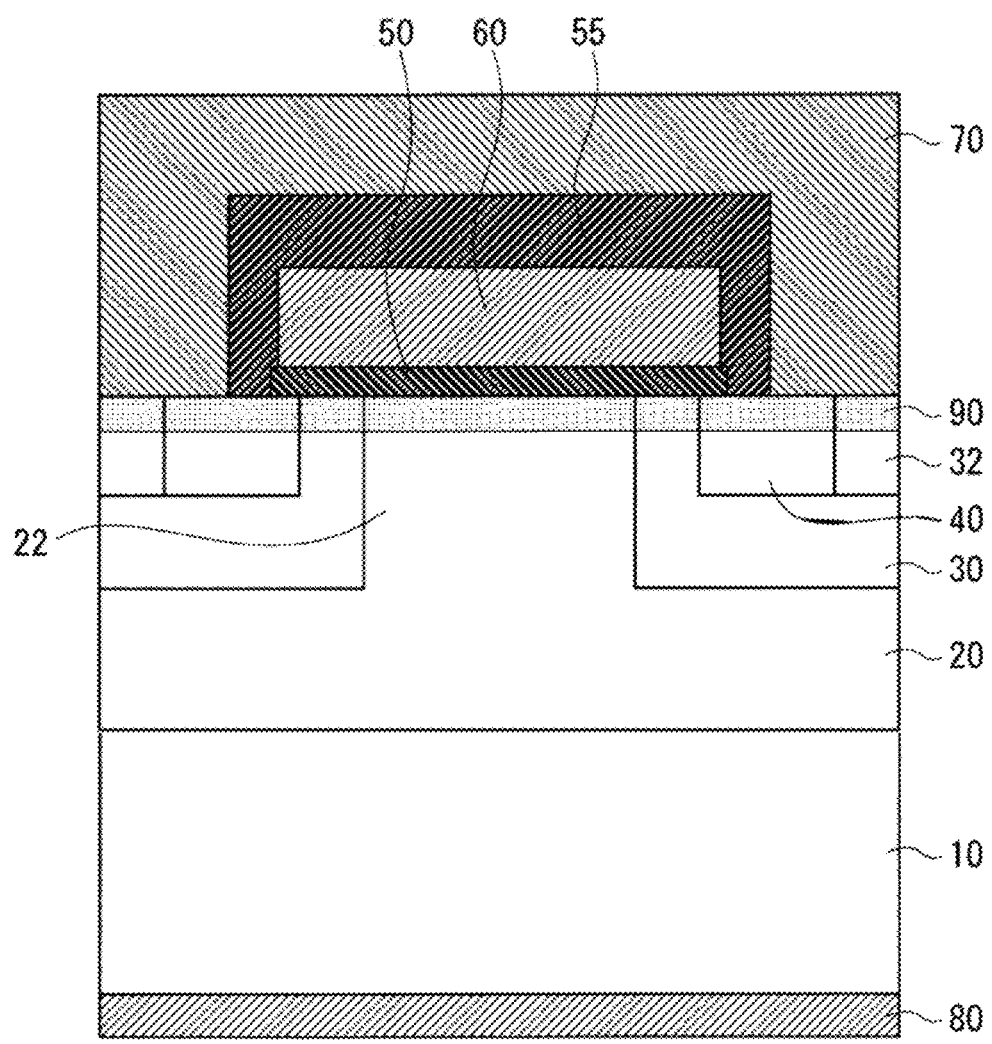

F I G. 5
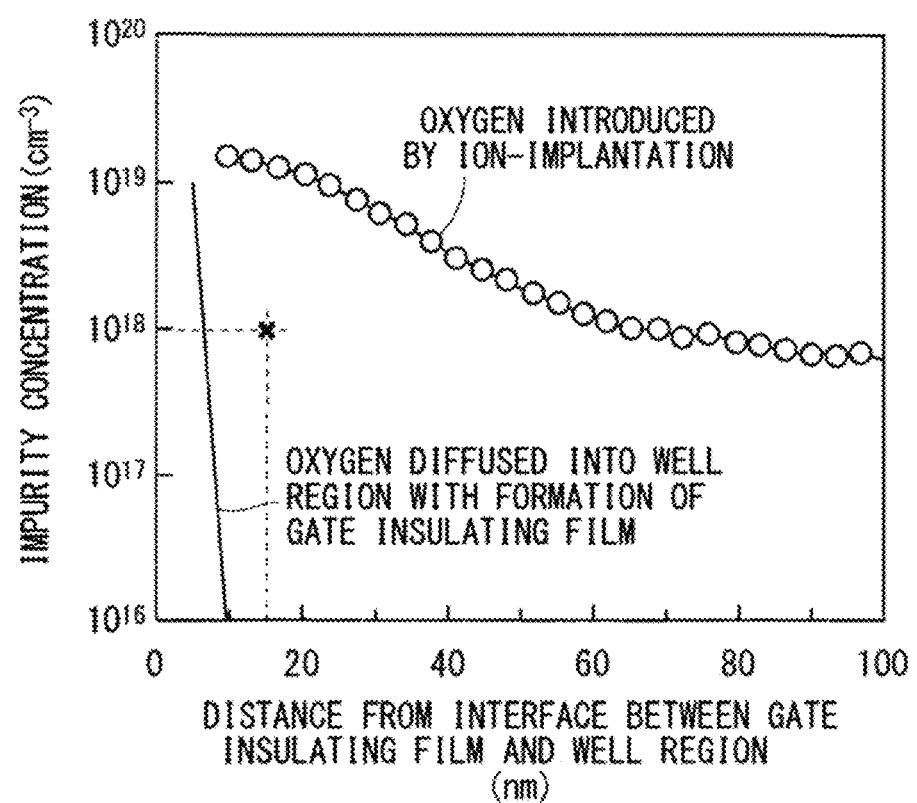

F I G. 7
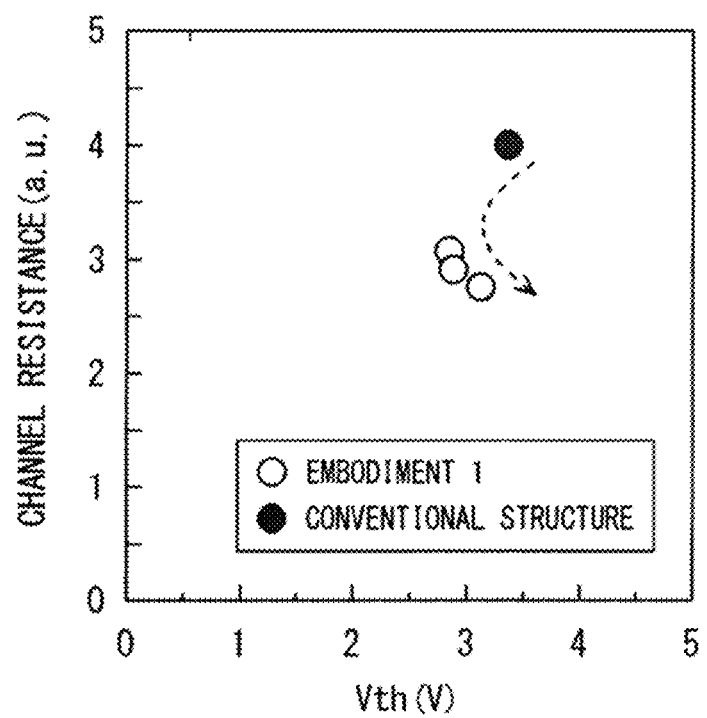

F I G. 1 8
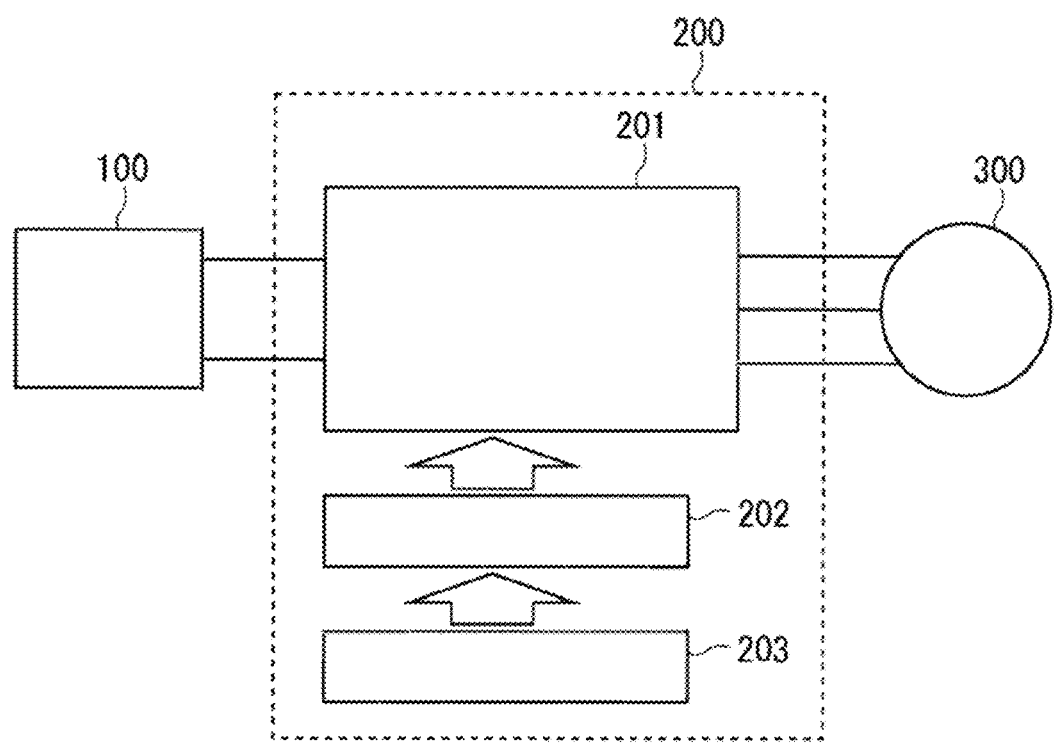

SILICON CARBIDE SEMICONDUCTOR DEVICE, POWER CONVERSION DEVICE, AND MANUFACTURING METHOD OF SILICON CARBIDE SEMICONDUCTOR DEVICE

CROSS-REFERENCE TO RELATED APPLICATIONS

The present application is based on PCT filing PCT/JP2019/038129, filed Sep. 27, 2019, which claims priority to JP 2019-050084, filed Mar. 18, 2019, the entire contents of each are incorporated herein by reference.

TECHNICAL FIELD

The present invention relates to a silicon carbide semiconductor device composed of silicon carbide, a manufacturing method of the same, and a power conversion device using the same.

BACKGROUND ART

In an insulated gate field effect transistor (MOSFET: Metal-Oxide-Semiconductor Field-Effect-Transistor) formed using silicon carbide, there has been a problem of the high channel resistance due to many electrical defects at the interface between the gate insulating film and the semiconductor layer. Therefore, for example, measures such as lowering the channel resistance by introducing nitrogen in the vicinity of the interface between the gate insulating film and the semiconductor layer have been considered (for example, Non-Patent Document 1 below).

On the other hand, it is known that increasing the nitrogen concentration at the interface between the gate insulating film and the semiconductor layer of the MOSFET generally lowers the threshold voltage of the MOSFET. When the threshold voltage of the MOSFET lowers, a malfunction or the like occurs due to the flow of a current during the MOSFET is turned off when it is used as a normally-off device, arising problems that the reliability of the operation of the MOSFET lowers.

In addition, as a method of forming a gate insulating film on a silicon carbide semiconductor layer, there is a method in which the silicon-carbon bond is broken by ion implantation of an ion species into the semiconductor layer, the carbon whose bond was broken is oxidized, and then a gate insulating film (gate oxide film) is formed by oxidizing the silicon whose bond was broken (for example, Patent Document 1 below). According to the method, a gate insulating film having a low carbon content and a thin film thickness can be formed, and a silicon carbide semiconductor device suitable for normally-off can be produced.

PRIOR ART DOCUMENTS

Patent Documents

[Patent Document 1] Japanese Patent Application Laid-Open No. 11-274487

Non-Patent Documents

[Non-Patent Document] K. Ueno, T. Oikawa, "Counter-doped MOSFET's of 4H-SiC", IEEE Electron Device Lett., vol. 20, pp. 624-626, December 1999

SUMMARY

Problem to be Solved by the Invention

In the MOSFET formed by the methods of Non-Patent Document 1 and Patent Document 1, the channel resistance increases when the threshold voltage is set high. Therefore, both a low on-resistance and a high threshold voltage of the MOSFET are difficult to achieve.

The present invention has been made to solve the above problems, and an object of the present invention is to provide a silicon carbide semiconductor device capable of setting a high threshold voltage while suppressing an increase in the on-resistance.

Means to Solve the Problem

According to the present invention, the silicon carbide semiconductor device includes a semiconductor substrate composed of silicon carbide, a drift layer composed of n-type silicon carbide formed on the semiconductor substrate, a well region of p-type formed on a surface portion of the drift layer, a source region of n-type formed on a surface portion of the well region and formed separated from the drift layer, a gate insulating film formed so as to be in contact with the source region, the well region, and the drift layer, a gate electrode formed so as to be opposite the well region via the gate insulating film, and a source electrode connected to the source region, in which oxygen is contained in a region having a predetermined thickness from an interface between the well region and the gate insulating film toward the well regions side.

Effects of the Invention

According to the present invention, the threshold voltage can be increased while suppressing an increase in the on-resistance of the silicon carbide semiconductor device. Therefore, a silicon carbide semiconductor device having low loss and high reliability can be obtained.

BRIEF DESCRIPTION OF DRAWINGS

FIG. 1 A schematic cross-sectional view of a silicon carbide semiconductor device according to Embodiment 1 of the present invention.

FIG. 5 A concentration distribution graph of oxygen in the depth direction of the channel region of the silicon carbide semiconductor device according to Embodiment 1 of the present invention.

FIG. 7 A graph illustrating the relationship between the threshold voltage and the channel resistance value of the silicon carbide semiconductor device according to Embodiment 1 of the present invention.

FIG. 18 A schematic diagram illustrating a configuration of a power conversion device according to Embodiment 4 of the present invention.

DESCRIPTION OF EMBODIMENTS

Figure 2:
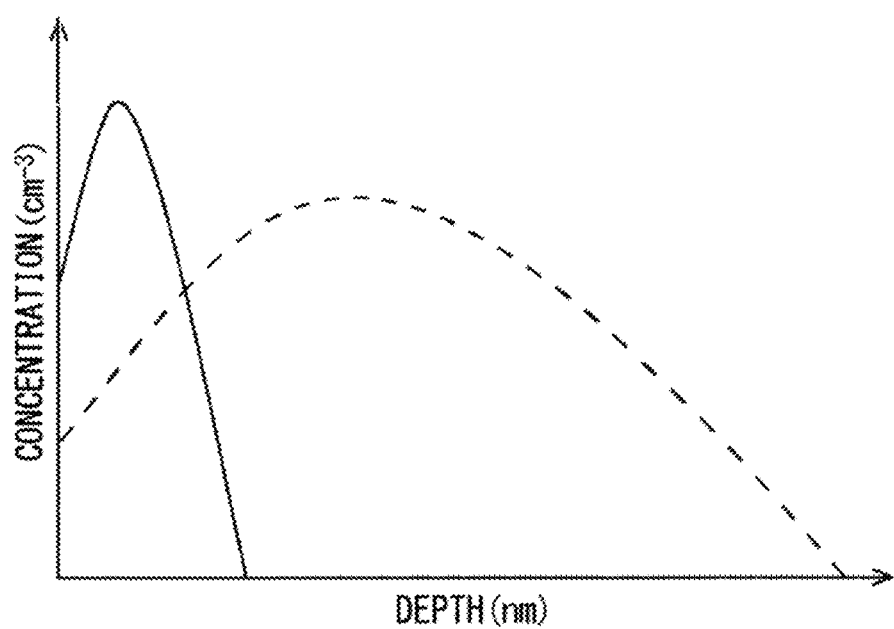
FIG. 2 A graph illustrating a concentration distribution of oxygen and a concentration distribution of p-type impurities in the depth direction in a channel region of the silicon carbide semiconductor device according to Embodiment 1 of the present invention.

Hereinafter, Embodiments will be described with reference to the attached drawings. The drawings are schematic, and the positions and sizes of the elements shown in the drawings are not always accurate and can be changed as appropriate. Further, in each drawing, elements having the same function are designated by the same reference numerals, and duplicate description thereof will be omitted below.

Embodiment 1

FIG. 1 is a schematic cross-sectional view of a silicon carbide MOSFET (SiC-MOSFET) according to Embodiment 1.

The SiC-MOSFET according to Embodiment 1 is formed by using a semiconductor substrate 10 composed of n-type low-resistance silicon carbide. A drift layer 20 composed of n-type silicon carbide is formed on the front surface of the semiconductor substrate 10. A plurality of well regions 30 composed of p-type silicon carbide are formed on the surface portion of the drift layer 20. Hereinafter, the region interposed between the well regions 30 in the drift layer 20 is referred to as a "junction region 22".

On the surface portion of each well region 30, a source region 40 composed of n-type silicon carbide is formed at a position separated from the junction region 22 (that is, a position inside the well region 30). Further, a contact region 32 composed of p-type low-resistance silicon carbide is formed inside the source region 40 in the surface portion of each well region 30. That is, in the surface portion of the well region 30, the source region 40 is located between the junction region 22 and the contact region 32.

A gate insulating film 50 is formed on the surface of the drift layer 20 so as to cover the surfaces of the well regions 30 and the source regions 40. On the gate insulating film 50, a gate electrode 60 is formed at least above the well regions 30 between the junction region 22 and the source regions 40. That is, the portions of the well regions 30 between the junction region 22 and the source regions 40 are opposite the gate electrode 60 via the gate insulating film 50, and the surface portions thereof are channel regions in which channels are formed when the SiC-MOSFET is turned on.

Nitrogen may be added to the interfaces, serving as the channel regions, between the surface portions of the well regions 30 and the gate insulating film 50. In Embodiment 1, nitrogen is added to the interfaces at a high concentration, and the nitrogen concentration is $1\times10^{20}$ cm$^{-3}$ or more.

An interlayer insulating film 55 is formed on the gate electrode 60, and a source electrode 70 is formed on the interlayer insulating film 55. Contact holes are formed in the interlayer insulating film 55 which reach the surfaces of the source regions 40 and the contact regions 32, and the source electrode 70 is connected to the source regions 40 and the contact regions 32 through the contact holes. A drain electrode 80 is formed on the rear surface of the semiconductor substrate 10, that is, the surface opposite to the drift layer 20.

Here, in the SiC-MOSFET of Embodiment 1, oxygen is added to regions having a predetermined thickness from the interfaces between the well regions 30 and the gate insulating film 50 toward the well regions 30 side. Although, oxygen may be added to at least the surface portions of the well regions 30 serving as the channel regions, oxygen may also be added to at least a part of the junction region 22 of the drift layer 20. Oxygen added to the junction region 22 acts as n-type impurities and contributes to lowering the resistance of the junction region 22. In Embodiment 1, as illustrated in FIG. 1, an oxygen-containing region 90 containing oxygen is provided on the surface portions of the drift layer 20 (the junction region 22), the well regions 30, the source regions 40, and the contact regions 32 on the gate insulating film 50 side.

FIG. 2 is a graph illustrating a concentration distribution of oxygen and a concentration distribution of p-type impurities in the depth direction in a channel region of the silicon carbide semiconductor device according to Embodiment 1. In FIG. 2, the solid line represents the oxygen concentration distribution, and the broken line represents the concentration distribution of p-type impurities such as aluminum (Al).

As illustrated in FIG. 2, oxygen is distributed at a high concentration on the surface side of the well region 30, and in the vicinity of the surface of the well region 30, oxygen is higher in concentration than the p-type impurities. The oxygen concentration peak is within the well region 30. Oxygen is distributed in the well region 30 within at least 10 nm from the interface between the well region 30 and the gate insulating film 50. The interface between the well region 30 and the gate insulating film 50 is defined as a position where the carbon concentration is halved in volume density of that of the silicon carbide layer such as the drift layer 20.

Figure 3:
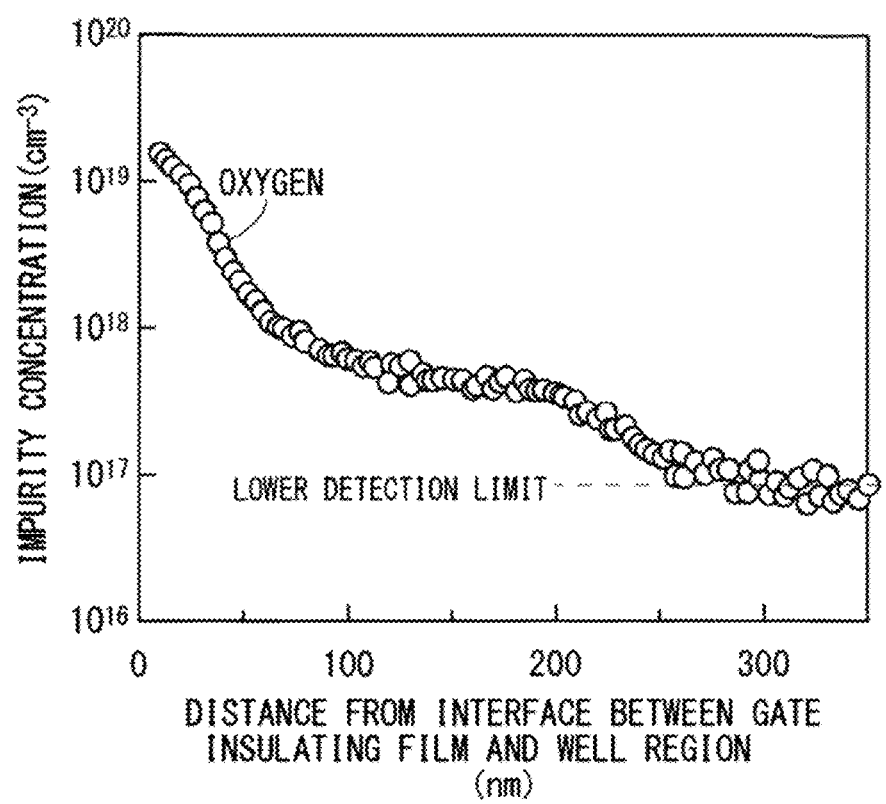
FIG. 3 A concentration distribution graph of oxygen in the depth direction of the channel region of the silicon carbide semiconductor device according to Embodiment 1 of the present invention.

FIG. 3 illustrates a specific example of the oxygen impurity concentration profile. In FIG. 3, the peak concentration of oxygen is $1.5 \times 10^{19}$ cm$^{-3}$, and oxygen is present at a concentration of $1 \times 10^{17}$ cm$^{-3}$ or more from the interface between the well region 30 and the gate insulating film 50 toward a depth of about 300 nm. The oxygen concentration at the interface between the well region 30 and the gate insulating film 50 is approximately $1.5 \times 10^{19}$ cm$^{-3}$, which is higher than the n-type impurity concentration of the drift layer 20.

Figure 4:
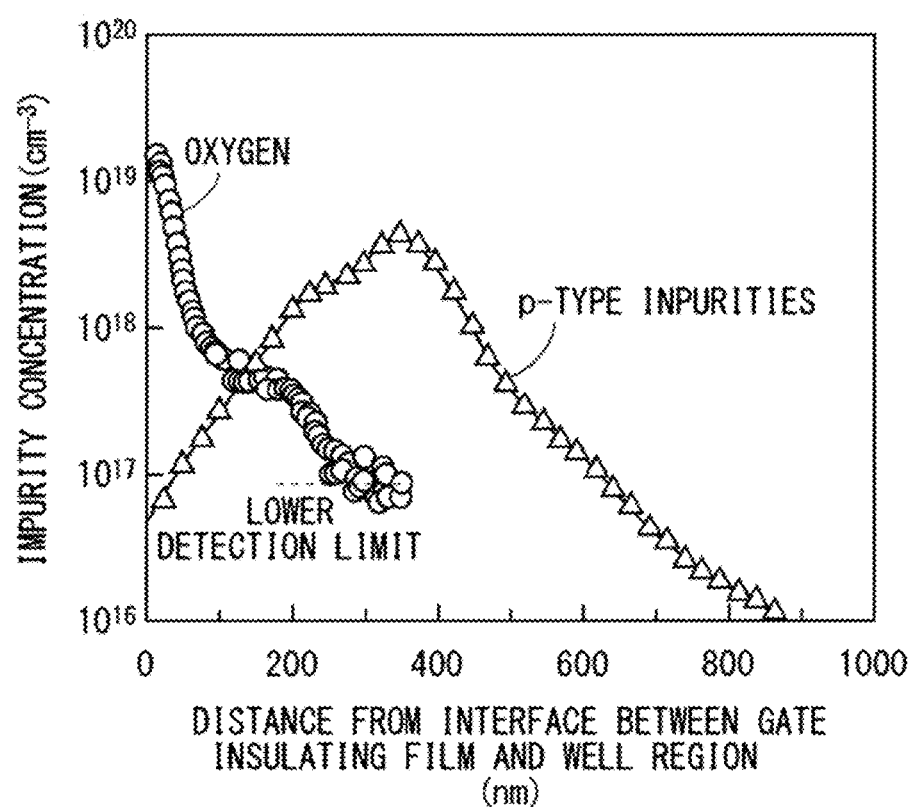
FIG. 4 A concentration distribution graph of oxygen and p-type impurities in the depth direction of the channel region of the silicon carbide semiconductor device according to Embodiment 1 of the present invention.

FIG. 4 illustrates a specific example of the impurity concentration profiles of oxygen and p-type impurities. The peak concentration of p-type impurities is $4 \times 10^{18}$ cm$^{-3}$, and the p-type impurities having a concentration of $1 \times 10^{16}$ cm$^{-3}$ or more are present from the interface between the well region 30 and the gate insulating film 50 toward about 850 nm. In the region of about 120 nm or lower from the interface between the well region 30 and the gate insulating film 50, the oxygen concentration is higher than the p-type impurity concentration at any position. At the interface between the well region 30 and the gate insulating film 50, the oxygen concentration is approximately $1.5 \times 10^{19}$ cm$^{-3}$, which is higher than the p-type impurity concentration. The oxygen concentration in a region 30 nm away from the interface between the well region 30 and the gate insulating film 50 toward the well region 30 side is $6.3 \times 10^{18}$ cm$^{-3}$. In a region 30 nm or more away from the interface between the well region 30 and the gate insulating film 50 toward the well region 30 side, a region in which the oxygen concentration is higher than the p-type impurity concentration in the well region 30 is present. The concentration of n-type impurities in the drift layer 20 is in the range of $1 \times 10^{14}$ cm$^{-3}$ to $1 \times 10^{17}$ cm$^{-3}$, and in a region 30 nm or more away from the interface between the well region 30 and the gate insulating film 50 toward the well region 30 side, a region in which the oxygen concentration is higher than the n-type impurity concentration in the drift layer 20 is present.

Next, a manufacturing method of the SiC-MOSFET being the silicon carbide semiconductor device according to Embodiment 1 will be described.

First, the semiconductor substrate 10 composed of n-type low-resistance silicon carbide, having a plane orientation (0001) in which a plane orientation of a surface (first main surface) has an off-angle, and having a 4H polytype is prepared. Then, the drift layer 20 composed of n-type silicon carbide is epitaxially grown on the semiconductor substrate 10 by the chemical vapor deposition (CVD) method. The impurity concentration of the drift layer 20 is to be $1 \times 10^{14}$ cm$^{-3}$ or more and $1 \times 10^{17}$ cm$^{-3}$ or less, and the thickness of the drift layer 20 is to be 5 μm or more and 200 μm or less.

Subsequently, an implantation mask in which the formation region of the well region 30 is opened is formed on the surface of the drift layer 20 by a photoresist or the like, and aluminum (Al) being p-type impurities is ion-implanted into the drift layer 20 through the implantation mask. At this point, the depth of Al ion implantation is to be about 0.5 to 3 μm within the range not exceeding the thickness of the drift layer 20. The impurity concentration of the ion-implanted Al is higher than the n-type impurity concentration of the drift layer 20, and is in the range of $1 \times 10^{15}$ cm$^{-3}$ or more and $1 \times 10^{19}$ cm$^{-3}$ or less. Then remove the implantation mask. The region where Al is ion-implanted in this step becomes the well region 30.

Next, an implantation mask in which the formation region of the source region 40 is opened is formed on the surface of the drift layer 20 by a photoresist or the like, and nitrogen (N) being n-type impurities is ion-implanted into the drift layer 20 through the implantation mask. At this point, the ion implantation depth of N is made shallower than the thickness of the well region 30. The impurity concentration of the ion-implanted N is in the range exceeding the p-type impurity concentration in the well region 30 which is to be in the range of $1 \times 10^{18}$ cm$^{-3}$ or more and $1 \times 10^{21}$ cm$^{-3}$ or less. In the region where N was implanted in this step, the region showing n-type is to be the source region 40.

Then, an implantation mask in which the formation region of the contact region 32 is opened is formed on the surface of the drift layer 20 by a photoresist or the like, and Al being p-type impurities is ion-implanted into the drift layer 20 through the implantation mask. At this point, the depth of Al ion implantation is within the range not exceeding the thickness of the drift layer 20 and is to be about 0.5 to 3 μm. The impurity concentration of the ion-implanted Al is higher than the n-type impurity concentration of the drift layer 20 and the p-type impurity concentration of the well region 30, and is in the range of $1 \times 10^{18}$ cm$^{-3}$ or more and $1 \times 10^{21}$ cm$^{-3}$ or less. Then remove the implantation mask. The region where Al is ion-implanted in this step becomes the contact region 32.

Next, oxygen (O) is ion-implanted from the surface of the drift layer 20 including the well regions 30 and the source regions 40 to a predetermined depth. The region where Al is ion-implanted in this step becomes the oxygen-containing region 90. Oxygen only needs to be added to the surface portions of the well regions 30 being the channel regions; therefore, the ion implantation of oxygen may be performed via an implantation mask in which a part of the drift layer 20 including the well regions 30 and the source regions 40 is opened. For example, following the ion implantation of the p-type impurities for forming the well regions 30, the ion implantation of oxygen may be performed using the implantation mask used for the ion implantation of the p-type impurities.

Subsequently, the semiconductor substrate 10 on which the drift layer 20, the well regions 30, the source regions 40, the contact regions 32, and the oxygen-containing region 90 are formed is subjected to annealing, by a heat treatment apparatus, at a temperature of 1300 to 1900° C. for 30 seconds to 1 hour in an atmosphere of an inert gas such as argon (Ar) gas. By this annealing, the ions implanted in each region are electrically activated.

Next, the surface of the drift layer 20 including the well regions 30 and the source regions 40 is thermally oxidized to form a silicon oxide film being a gate insulating film 50, on the surface of the drift layer 20. Further, when the gate insulating film 50 is formed, nitriding treatment in a gas containing nitrogen is also performed in order to reduce defects at the interfaces between the gate insulating film 50 and the channel regions.

Here, the depth of the oxygen-containing region 90 after the formation of the gate insulating film 50 is 100 nm or more and 800 nm or less, and is about 300 nm, for example. The oxygen concentration in the oxygen-containing region 90 has a peak value of $1 \times 10^{17}$ cm$^{-3}$ or more and $2 \times 10^{21}$ cm$^{-3}$ or less, and is $1 \times 10^{19}$ cm$^{-3}$, for example. The surface density (total dose amount) of oxygen contained in the well region 30 is $1 \times 10^{11}$ cm$^{-2}$ or more and $1 \times 10^{17}$ cm$^{-2}$ or less, preferably $1 \times 10^{12}$ cm$^{-2}$ or more and $5 \times 10^{15}$ cm$^{-2}$ or less, and $8 \times 10^{12}$ cm$^{-2}$ or more and $3 \times 10^{14}$ cm$^{-2}$ or less is even more desirable.

As illustrated in FIG. 5, the concentration of oxygen diffused into the well region 30 with the formation of the gate insulating film 50 sharply decreases as the distance from the interface between the well region 30 and the gate insulating film 50 increases. On the other hand, the oxygen introduced by ion implantation is distributed over a wide area within the well region 30. For example, the oxygen concentration introduced by ion implantation is $1\times10^{18}$ cm$^{-3}$ or more in a region with a thickness of 15 nm from the interface between the well region 30 and the gate insulating film 50 toward the well region 30 side.

After the gate insulating film 50 is formed, a conductive polycrystalline silicon film is formed on the gate insulating film 50 by a low pressure CVD method, and the gate electrode 60 is formed by patterning the film. At this point, the gate electrode 60 is disposed so as to face the well regions 30 containing oxygen via the gate insulating film 50 such that the gate electrode 60 and the well regions 30 containing oxygen are capacitively coupled. The SiC-MOSFET of Embodiment 1 is a planar gate type, and the gate electrode 60 is disposed above the well regions 30 containing oxygen.

Next, the interlayer insulating film 55 composed of silicon oxide is formed by the low pressure CVD method so as to cover the gate electrode 60. Then, contact holes reaching the source regions 40 and the contact regions 32 are formed in the interlayer insulating film 55, and the source electrode 70 connected to the source regions 40 and the contact regions 32 through the contact holes is formed on the interlayer insulating film 55. Further, the drain electrode 80 connected to the semiconductor substrate 10 is formed on the rear surface (second main surface) of the semiconductor substrate 10. Through the above steps, the SiC-MOSFET of Embodiment 1 illustrated in FIG. 1 is completed.

Although, in Embodiment 1, the activation annealing of the ion-implanted oxygen was performed at the same time as the activation annealing of the ion-implanted Al as the p-type impurities and the ion-implanted N as the n-type impurities, they may be performed in separate steps. Also, either the implantation of oxygen or the implantation of Al and N may be performed first. Also, in Embodiment 1, although oxygen is added by ion implantation, the method of adding oxygen is not limited thereto, and for example, oxygen may be added at the time of epitaxial growth of the drift layer 20.

Figure 6:
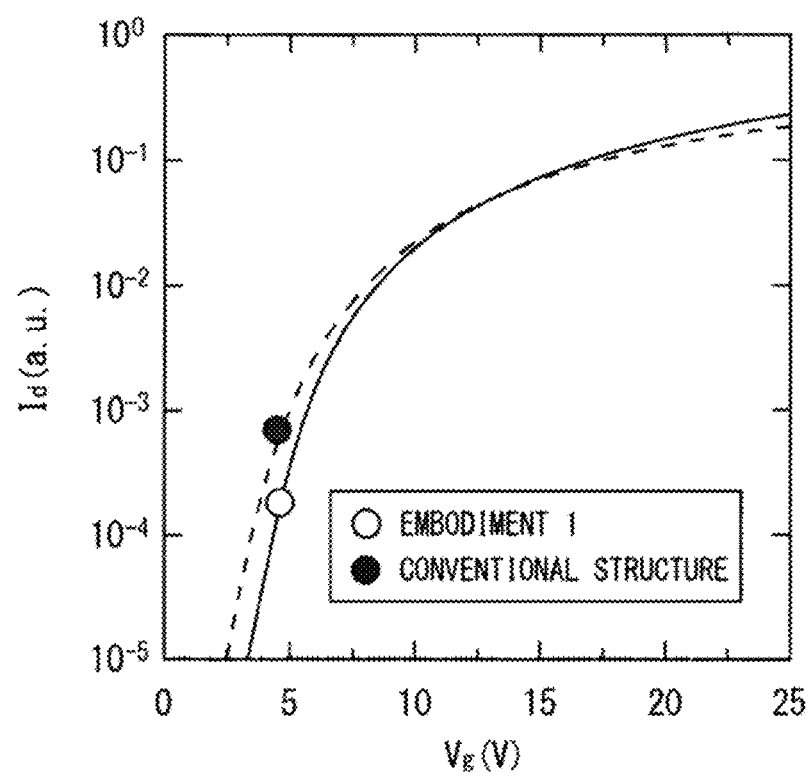
FIG. 6 An $I_d$-$V_g$ characteristics graph of the silicon carbide semiconductor device according to Embodiment 1 of the present invention.

Here, the electrical characteristics of the SiC-MOSFET being the silicon carbide semiconductor device of Embodiment 1, will be described. FIG. 6 is a graph illustrating the relationship ($I_d$-$V_g$ characteristic) between the gate voltage and the drain current of the SiC-MOSFET of Embodiment 1 in comparison with the SiC-MOSFET of conventional structure to which oxygen is not added. In the graph of FIG. 6, the horizontal axis represents the gate voltage and the vertical axis represents the drain current. Further, the characteristics of the SiC-MOSTET of Embodiment 1 are shown by a solid line, and the characteristics of the SiC-MOSTET of conventional structure are shown by a broken line. From FIG. 6, it can be seen that, in the SiC-MOSTET of Embodiment 1, the threshold voltage becomes higher and the drain current is increased more than in the SiC-MOSTET of conventional structure.

FIG. 7 is a graph illustrating the relationship between the threshold voltage ($V_{th}$) and the channel resistance value of the SiC-MOSFET of Embodiment 1 in comparison with the SiC-MOSFET of conventional structure to which oxygen is not added. In the graph of FIG. 7, the horizontal axis represents the threshold voltage and the vertical axis represents the channel resistance value. Further, the characteristics of the SiC-MOSTET of Embodiment 1 are shown by a white circle, and the characteristics of the SiC-MOSTET of conventional structure are shown by a black circle. Further, in the graph of FIG. 7, a plurality of white circles showing the characteristics of the SiC-MOSTET of Embodiment 1 are drawn, and the concentration of oxygen to be added increases along the direction indicated by the broken line arrow.

From FIG. 7, the SiC-MOSTET of Embodiment 1 shows the same characteristics as the SiC-MOSTET of conventional structure when the concentration of oxygen to be added is low, however, it can be seen that, as the concentration of oxygen to be added increases, the threshold voltage increases, and the channel resistance value decreases. As described above, in the SiC-MOSTET of Embodiment 1, the threshold voltage can be controlled by the concentration of oxygen to be added.

Figure 8:
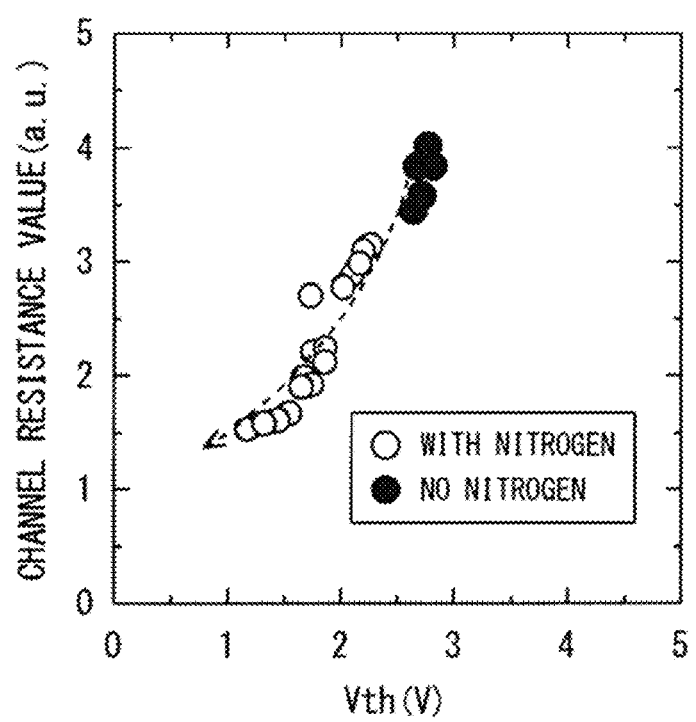
FIG. 8 A graph illustrating the relationship between the threshold voltage and the channel resistance value of the silicon carbide semiconductor device of the comparative example with respect to the silicon carbide semiconductor device of Embodiment 1 of the present invention.

FIG. 8 is a graph illustrating the relationship between the threshold voltage ($V_{th}$) and the channel resistance value of the SiC-MOSTET of conventional structure, and illustrating the change in characteristics when the concentration of nitrogen to be added to the surface portion of the channel region is changed. In the graph of FIG. 8, the characteristics of SiC-MOSTET in which nitrogen is not added to the surface portion of the channel region are shown by black circles, and the characteristics of SiC-MOSTET in which nitrogen is added to the surface portion of the channel region are shown by white circles. The concentration of added nitrogen increases along the direction of the dashed arrow.

From FIG. 8, it can be seen that, although the channel resistance lowers when nitrogen is added to the surface portion of the channel region, the threshold voltage also lowers. Therefore, when the SiC-MOSTET with nitrogen added to the surface portions of the channel regions is used as a normally-off device that turns off when the gate voltage is 0V, a problem may possibly be raised that the SiC-MOSFET is not turned off sufficiently even if an off voltage (0V) is applied to the gate electrode.

On the other hand, in the SiC-MOSFET of Embodiment 1, as illustrated in FIG. 7, the addition of oxygen can increase the threshold voltage while lowering the channel resistance. Therefore, according to Embodiment 1, a SiC-MOSFET with low resistance and high reliability can be obtained.

This effect is obtained by oxygen being added in the channel regions, thereby, at the interface between the channel regions and the gate insulating film, increasing the negative fixed charge while increasing the defect level of the energy level, which is about 0.2 to 0.6 eV lower than the conduction band of silicon carbide, and trapping electrons at the impurity levels that oxygen forms in silicon carbide. In addition, oxygen introduced into the channel regions acts as n-type impurities (donor), which relaxes the electric fields at the interfaces between the gate insulating film 50 and the channel regions, so that the mobility of electrons in the channel regions is improved, which also contributes to the effect.

Figure 9:
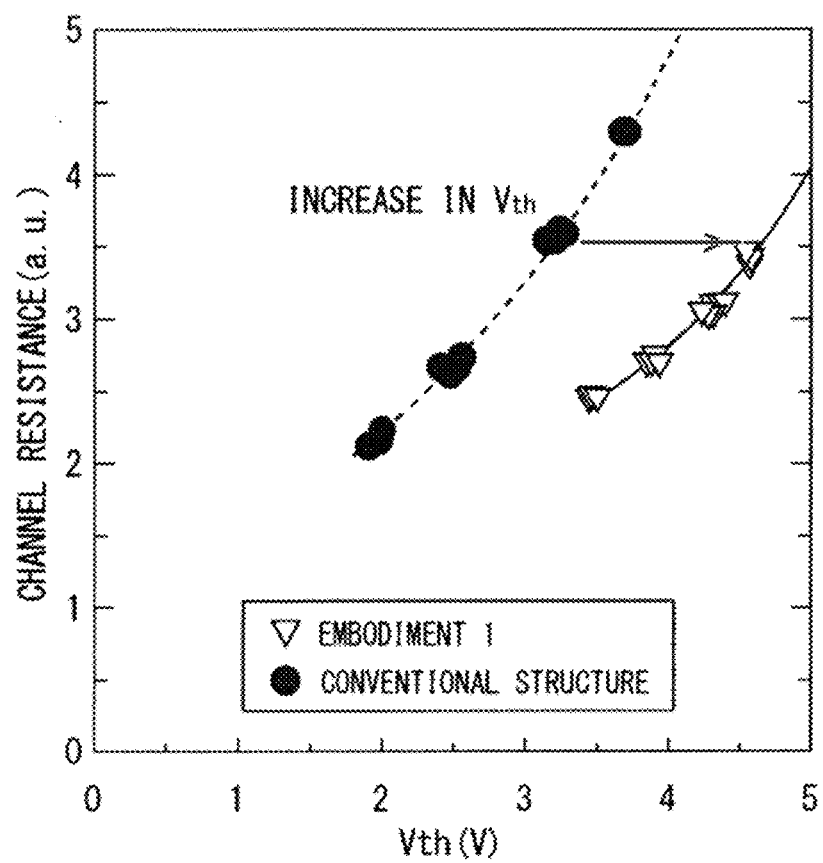
FIG. 9 A graph illustrating the relationship between the threshold voltage and the channel resistance value of the silicon carbide semiconductor device according to Embodiment 1 of the present invention.

FIG. 9 is a graph illustrating the relationship between the threshold voltage ($V_{th}$) and the channel resistance value of the SiC-MOSFET of Embodiment 1 in comparison with the SiC-MOSFET of conventional structure to which oxygen is not added. This graph illustrates the results of measurement for a plurality of devices in which the amount of oxygen added is constant. In the graph of FIG. 9, the horizontal axis represents the threshold voltage and the vertical axis represents the channel resistance value. Further, the characteristics of the SiC-MOSTET of Embodiment 1 are shown by triangles, and the characteristics of the SiC-MOSTET of conventional structure are shown by black circles. From FIG. 9, it can be seen that the trade-off characteristic between the threshold voltage and the channel resistance value in the SiC-MOSTET of Embodiment 1 is improved as compared with the trade-off characteristic between the threshold voltage and the channel resistance value of the SiC-MOSTET of conventional structure.

Figure 10:
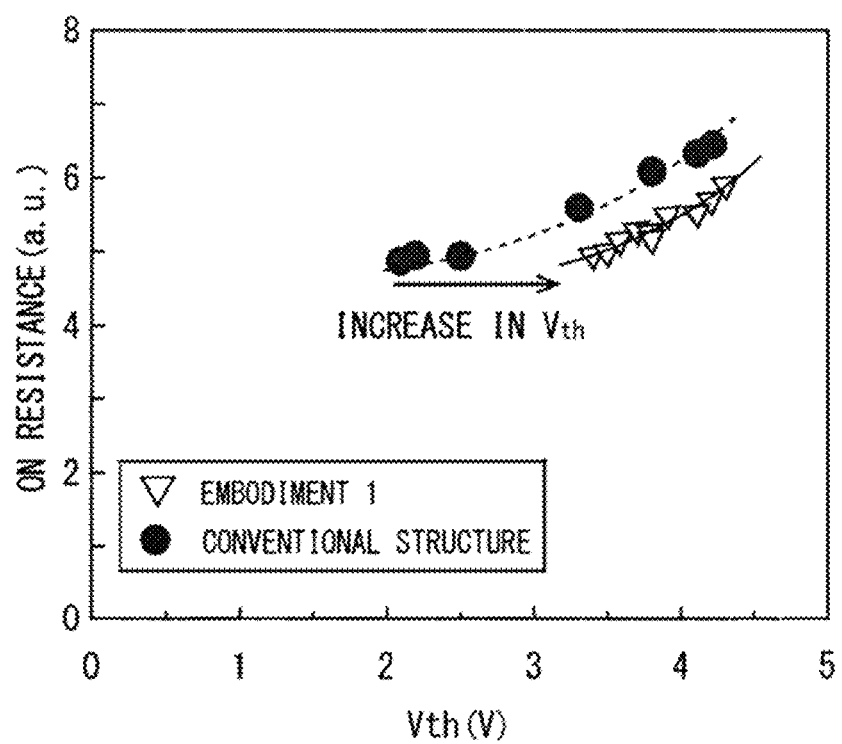
FIG. 10 A graph illustrating the relationship between the threshold voltage and the on-resistance value of the silicon carbide semiconductor device according to Embodiment 1 of the present invention.

FIG. 10 is a graph illustrating the relationship between the threshold voltage ($V_{th}$) and the on resistance value of the SiC-MOSFET of Embodiment 1 in comparison with the SiC-MOSFET of conventional structure to which oxygen is not added. In the graph of FIG. 10, the horizontal axis represents the threshold voltage and the vertical axis represents the on resistance value. Further, the characteristics of the SiC-MOSTET of Embodiment 1 are shown by triangles, and the characteristics of the SiC-MOSTET of conventional structure are shown by black circles. From FIG. 10, it can be seen that the trade-off characteristic between the threshold voltage and the on resistance value in the SiC-MOSTET of Embodiment 1 is improved as compared with the trade-off characteristic between the threshold voltage and the on resistance value of the SiC-MOSTET of conventional structure.

Embodiment 2

Figure 11:
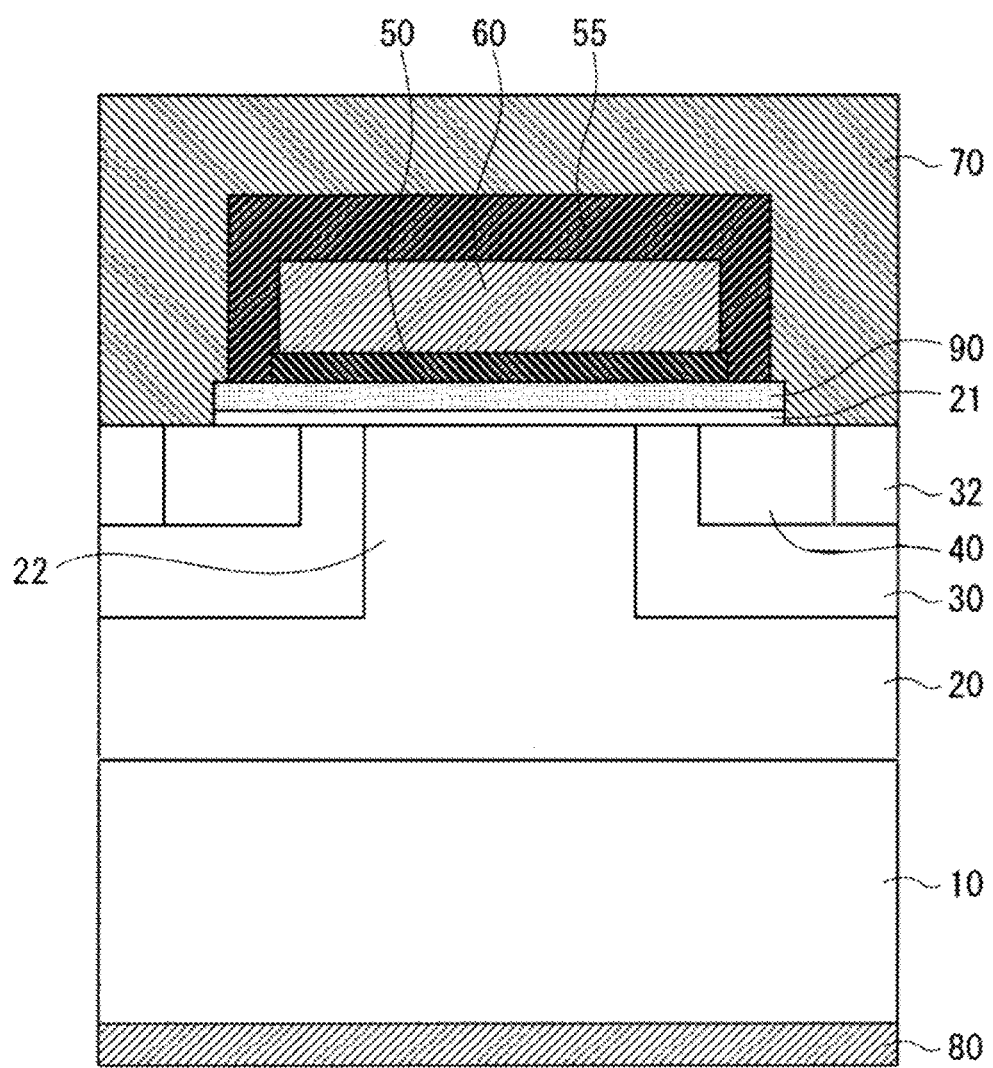
FIG. 11 A schematic cross-sectional view of a silicon carbide semiconductor device according to Embodiment 2 of the present invention.

FIG. 11 is a schematic cross-sectional view of a SiC-MOSFET being a silicon carbide semiconductor device according to Embodiment 2. The SiC-MOSTET of Embodiment 2 has a so-called epi-channel structure including an epitaxial growth layer (hereinafter referred to as "epi-channel layer") that functions as a channel on a surface of the drift layer 20.

As illustrated in FIG. 11, in the SiC-MOSTET of Embodiment 2, an epi-channel layer 21 is formed on the surface of the drift layer 20 so as to straddle between source regions 40 formed in adjacent well regions 30. Further, a gate insulating film 50 and a gate electrode 60 are formed on the epi-channel layer 21.

The epi-channel layer 21 is formed by the CVD method so as to epitaxially grow from the underlying layer. The epi-channel layer 21 is composed of n-type, p-type or i-type silicon carbide, and its thickness is 5 nm or more and 200 nm or less. When the epi-channel layer 21 is n-type or p-type, its impurity concentration is $1\times10^{15}$ cm$^{-3}$ or more and $2\times10^{18}$ cm$^{-3}$ or less.

In the SiC-MOSFET of Embodiment 2, oxygen is added to a region having a predetermined thickness from the interface between the epi-channel layer 21 and the gate insulating film 50 toward the epi-channel layer 21 side. That is, the oxygen-containing region 90 containing the added oxygen is provided on the surface portion of the epi-channel layer 21 on the gate insulating film 50 side. In Embodiment 2, oxygen is added at least in a thickness range of 10 nm from the interface between the epi-channel layer 21 and the gate insulating film 50. The interface between the epi-channel layer 21 and the gate insulating film 50 can be defined as a position where the carbon concentration is halved.

Other configurations of the SiC-MOSFET are basically the same as Embodiment 1 (FIG. 1), and description thereof is omitted here.

Next, a manufacturing method of the SiC-MOSFET being the silicon carbide semiconductor device according to Embodiment 2 will be described.

First, the semiconductor substrate 10 composed of n-type low-resistance silicon carbide, having a plane orientation (0001) in which a plane orientation of a front surface (first main surface) has an off-angle, and having a 4H polytype is prepared. Then, the drift layer 20 composed of n-type silicon carbide is epitaxially grown on the semiconductor substrate 10 by the CVD method.

Subsequently, p-type silicon carbide is epitaxially grown on the drift layer 20, or p-type impurities are ion-implanted into the surface portion of the drift layer 20 to form a p-type semiconductor layer to be the well regions 30. Then, an n-type semiconductor layer serving as the source regions 40 is formed by epitaxially growing n-type silicon carbide on the p-type semiconductor layer or ion-implanting n-type impurities into the surface portions of the p-type semiconductor layer. Also, the p-type contact regions 32 are formed by the ion implantation method. Here, using a heat treatment apparatus, annealing may be performed at a temperature of 1300 to 1900° C. for 30 seconds to 1 hour in an atmosphere of an inert gas such as argon (Ar) gas. By this annealing, the ions implanted in each region are electrically activated.

Next, a silicon carbide layer is epitaxially grown on the surfaces of the drift layer 20, the well regions 30, the source regions 40, and the contact regions 32 by the CVD method, and the silicon carbide layer is patterned by etching to form the epi-channel layer 21. Note, the formation of the p-type contact regions 32 may be performed after the formation of the epi-channel layer 21.

Subsequently, oxygen is ion-implanted into the surface portion of the epi-channel layer 21 to form the oxygen-containing region 90, and activation annealing is performed. The depth of the oxygen-containing region 90 into which oxygen is implanted is 100 nm or more and 800 nm or less, and is about 300 nm, for example. The oxygen concentration in the oxygen-containing region 90 is to be $1\times10^{17}$ cm$^{-3}$ or more and $2\times10^{21}$ cm$^{-3}$ or less at the peak value. The surface density of oxygen contained in the epi-channel layer 21 or both the epi-channel layer 21 and the well regions 30 below thereof is $1\times10^{11}$ cm$^{-2}$ or more and $5\times10^{14}$ cm$^{-2}$ or less, and $8\times10^{12}$ cm$^{-2}$ or more and $1\times10^{14}$ cm$^{-2}$ or less is desirable.

Subsequently, by a heat treatment apparatus, annealing is performed at a temperature of 1300 to 1900° C. for 30 seconds to 1 hour in an atmosphere of an inert gas such as argon (Ar) gas. By this annealing, the ions implanted in each region are electrically activated. Further, the gate insulating film 50 is formed on the epi-channel layer 21. A step of patterning and forming the epi-channel layer 21 by etching may be performed after the annealing step.

The concentration of oxygen diffused into the epi-channel layer 21 with the formation of the gate insulating film 50 sharply decreases as the distance from the interface between the epi-channel layer 21 and the gate insulating film 50 increases. On the other hand, the oxygen introduced by ion implantation is widely distributed in the epi-channel layer 21. For example, the oxygen concentration introduced by ion implantation is $1\times10^{18}$ cm$^{-3}$ or more in the region with a thickness of 15 nm from the interface between the epi-channel layer 21 and the gate insulating film 50 toward the epi-channel layer 21 side.

Next, the gate electrode 60 composed of low-resistance polycrystalline silicon is formed on the gate insulating film 50. Further, the interlayer insulating film 55 composed of silicon oxide is formed so as to cover the gate electrode 60. Then, contact holes reaching the source regions 40 and the contact regions 32 are formed in the interlayer insulating film 55, and the source electrode 70 connected to the source regions 40 and the contact regions 32 through the contact holes is formed on the interlayer insulating film 55. Further, the drain electrode 80 connected to the semiconductor substrate 10 is formed on the rear surface (second main surface) of the semiconductor substrate 10. Through the above steps, the SiC-MOSFET of Embodiment 2 illustrated in FIG. 11 is completed.

In the SiC-MOSTET of Embodiment 2, the threshold voltage can be increased while lowering the channel resistance as in the SiC-MOSFET of Embodiment 1. Therefore, a SiC-MOSFET with low resistance and high reliability can be obtained.

Figure 12:
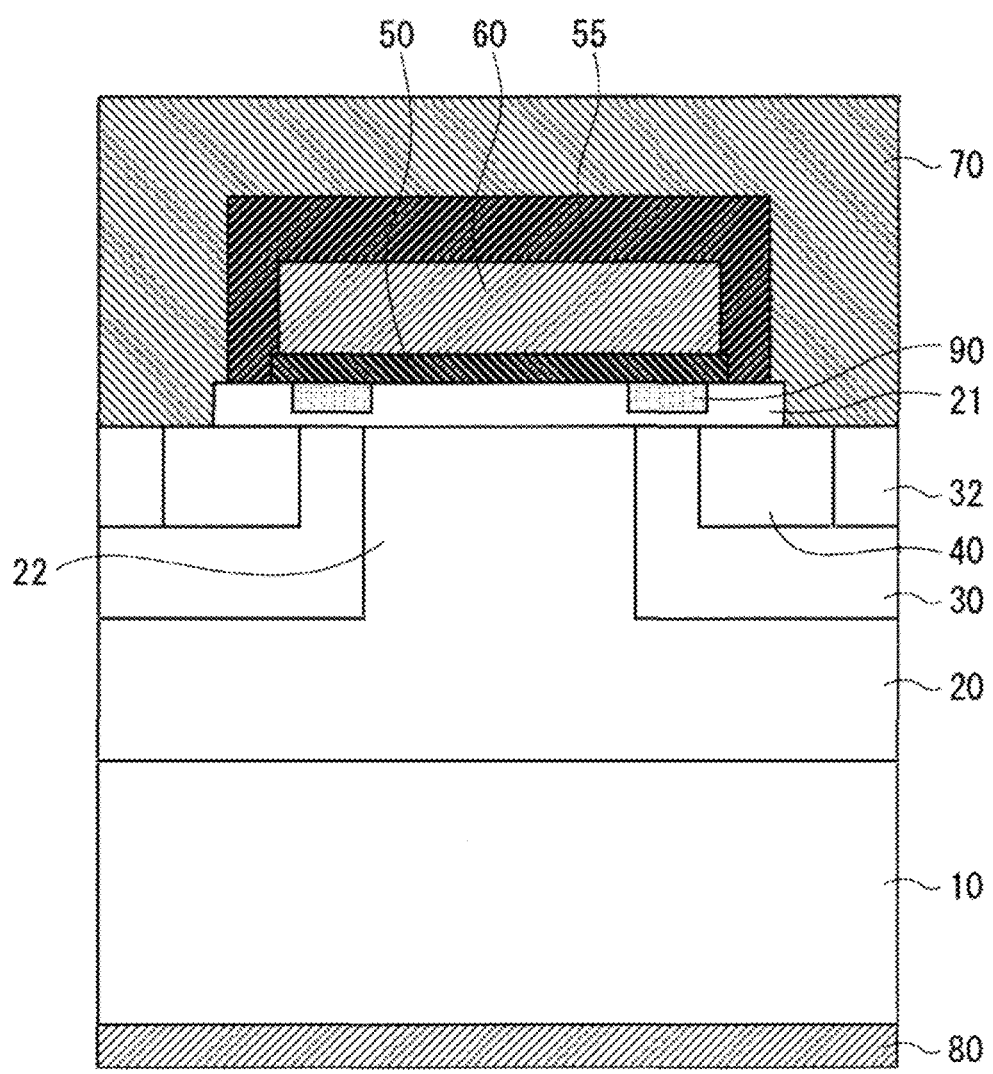
FIG. 12 A schematic cross-sectional view of the silicon carbide semiconductor device according to Embodiment 2 of the present invention.
Figure 13:
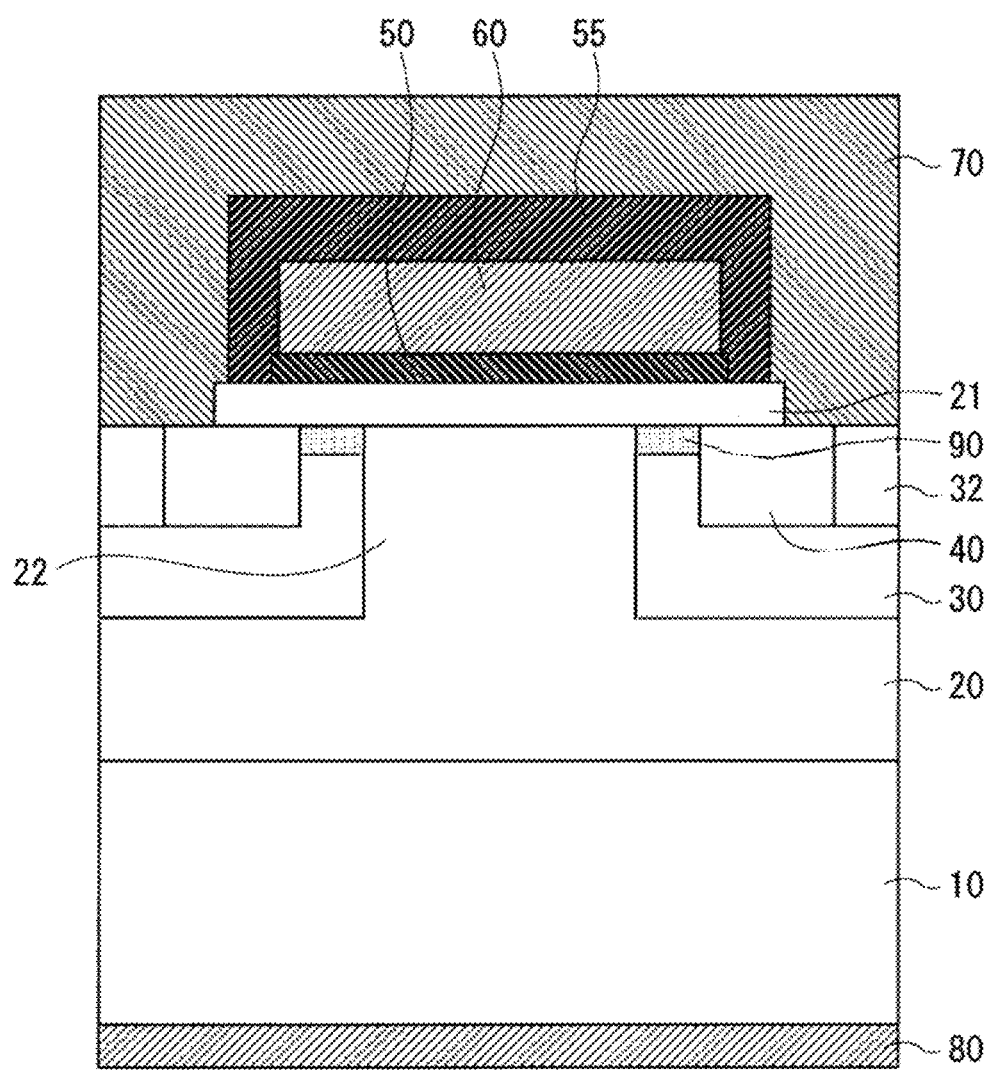
FIG. 13 A schematic cross-sectional view of the silicon carbide semiconductor device according to Embodiment 2 of the present invention.

FIGS. 12 and 13 are schematic cross-sectional views illustrating Modification of the SiC-MOSTET according to Embodiment 2.

Although, in FIG. 11, the oxygen-containing region 90 is formed on the entire surface of the epi-channel layer 21, as illustrated in FIG. 12, the oxygen-containing region 90 may be formed only in the vicinity of the portions of the epi-channel layer 21 where the channels are formed.

Further, as illustrated in FIG. 13, the oxygen-containing region 90 may be formed on the surface portions of the well regions 30. The oxygen-containing regions 90 on the surface portions of the well regions 30 can be formed by ion-implanting oxygen into the well regions 30, and the ion implantation may be performed before forming the epi-channel layer 21 or after forming the epi-channel layer 21. For example, when ions are implanted before forming the epi-channel layer 21, the oxygen concentration in the region having a thickness of 15 nm from the interface between the epi-channel layer 21 and the well region 30 toward the well region 30 side is $1 \times 10^{18}$ $cm^{-3}$ or more. The surface density (total dose amount) of oxygen contained in the well regions 30 or both the epi-channel layer 21 and the well regions 30 below thereof is $1 \times 10^{11}$ $cm^{-2}$ or more and $1 \times 10^{17}$ $cm^{-2}$ or less, $1 \times 10^{12}$ $cm^{-2}$ or more and $2 \times 10^{15}$ $cm^{-2}$ or less is desirable, and $8 \times 10^{12}$ $cm^{-2}$ or more and $3 \times 10^{14}$ $cm^{-2}$ or less is even more desirable.

In the example of FIG. 13, the concentration of oxygen diffused into the epi-channel layer 21 and the well regions 30 below thereof with the formation of the gate insulating film 50 sharply decreases as the distance from the interface between the epi-channel layer 21 and the gate insulating film 50 increases, the concentration of oxygen decreases further within the well region 30 as well. On the other hand, the oxygen introduced by ion implantation in the well regions 30 is widely distributed in the well regions 30.

Embodiment 3

Although, in Embodiments 1 and 2, the planar gate type SiC-MOSFET is illustrated as an example of the silicon carbide semiconductor device, the silicon carbide semiconductor device may be a trench gate type SiC-MOSFET. In Embodiment 3, an example of a trench gate type SiC-MOSFET is illustrated. Other configurations are the same as Embodiment 1; therefore, and description thereof is omitted.

Figure 14:
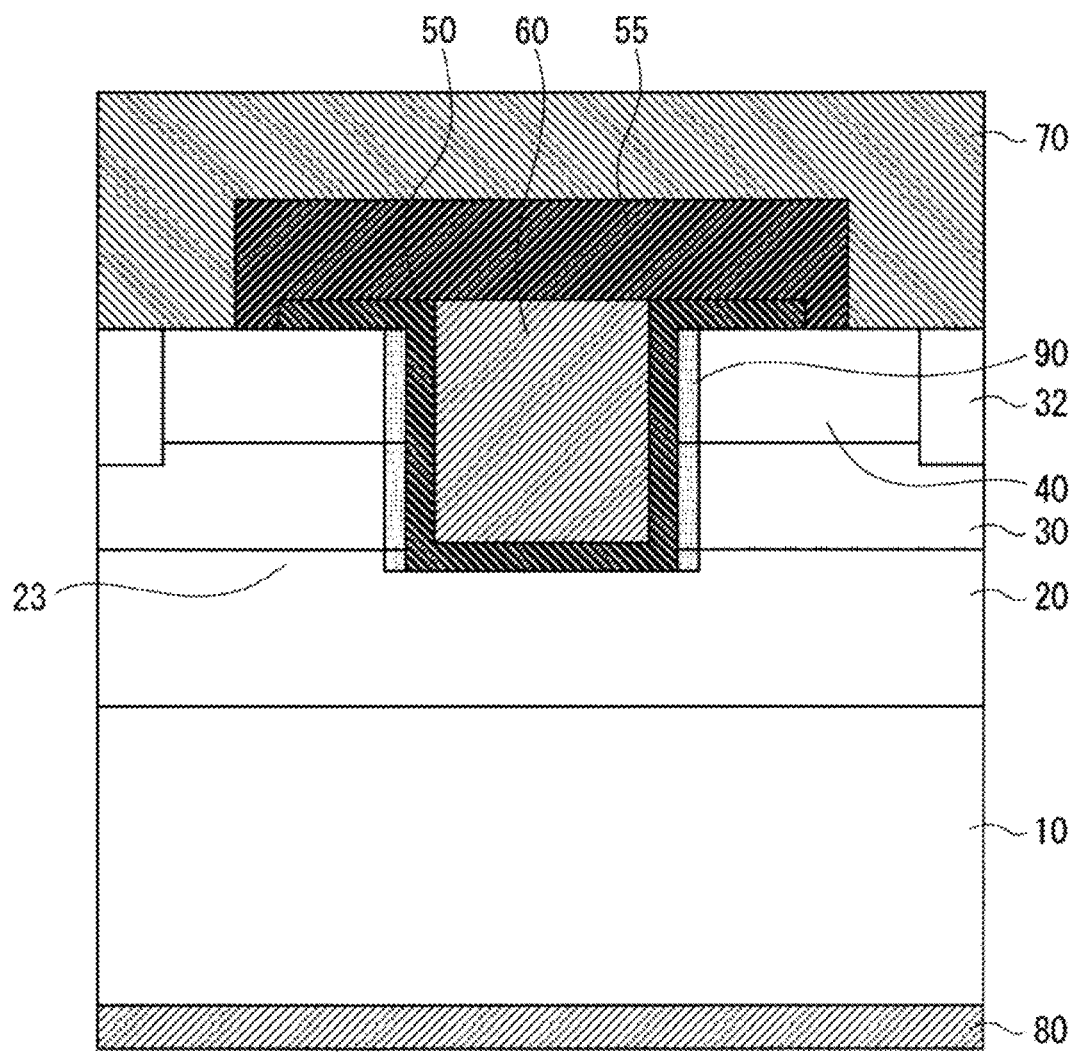
FIG. 14 A schematic cross-sectional view of a silicon carbide semiconductor device according to Embodiment 3 of the present invention.

FIG. 14 is a schematic cross-sectional view of a SiC-MOSFET being a silicon carbide semiconductor device according to Embodiment 3. As illustrated in FIG. 14, a drift layer 20 composed of n-type silicon carbide is formed on the front surface of the semiconductor substrate 10 composed of n-type silicon carbide. Well regions 30 composed of p-type silicon carbide are formed on the drift layer 20. Source regions 40 composed of n-type silicon carbide are formed on the well regions 30. Further, contact regions 32 composed of p-type low resistance silicon carbide are formed at positions adjacent to the source regions 40 so as to reach the well regions 30 from the front surface of the silicon carbide layer.

A trench having a depth reaching the drift layer 20 is formed in the silicon carbide layer, adjacent to the source regions 40 and the well regions 30, and a part of the gate insulating film 50 is formed inside the trench. A gate electrode 60 is formed on the gate insulating film 50 so as to be embedded in the trench. The gate electrode 60 in the trench is disposed so as to be opposite the well regions 30 via the gate insulating film 50. The portions of the well regions 30 opposite the gate electrode 60 are the channel regions. Hereinafter, the trench in which the gate electrode 60 is embedded is referred to as a "gate trench".

In the SiC-MOSFET of Embodiment 3, oxygen is added to regions having a predetermined thickness from the interfaces between the well regions 30 and the gate insulating film 50 toward the well regions 30 side. Here, as illustrated in FIG. 14, an oxygen-containing regions 90 to which oxygen is added are formed in portions of the well regions 30 and the source regions 40 in contact with the gate trench. Although, oxygen may be added to at least the surface portions (portions in contact with the gate trench) of the well regions 30 serving as the channel regions, oxygen may also be added to at least parts of the portions of the drift layer 20 that bond to the well regions 30 (hereinafter referred to as "junction regions 23"). Oxygen added to the junction regions 23 act as n-type impurities and contributes to lowering the resistance of the junction regions 23.

An interlayer insulating film 55 is formed on the gate electrode 60, and a source electrode 70 is formed on the interlayer insulating film 55. Contact holes are formed in the interlayer insulating film 55 which reach the surfaces of the source regions 40 and the contact regions 32, and the source electrode 70 is connected to the source regions 40 and the contact regions 32 through the contact holes. A drain electrode 80 is formed on the rear surface of the semiconductor substrate 10, that is, the surface opposite to the drift layer 20.

Next, a manufacturing method of the SiC-MOSFET being the silicon carbide semiconductor device according to Embodiment 3 will be described.

First, the semiconductor substrate 10 composed of n-type low-resistance silicon carbide, having a plane orientation (0001) in which a plane orientation of a front surface (first main surface) has an off-angle, and having a 4H polytype is prepared. Then, the drift layer 20 composed of n-type silicon carbide is epitaxially grown on the semiconductor substrate 10 by the CVD method.

Subsequently, p-type silicon carbide is epitaxially grown on the drift layer 20, or p-type impurities are ion-implanted into the surface portion of the drift layer 20 to form a p-type semiconductor layer to be the well regions 30. Then, an n-type semiconductor layer serving as the source regions 40 is formed by epitaxially growing n-type silicon carbide on the p-type semiconductor layer or ion-implanting n-type impurities into the surface portions of the p-type semiconductor layer.

Next, a trench is formed that extends through the source regions 40 and the well regions 30 and reaches the drift layer 20. Then, oxygen is ion-implanted into the side wall of the gate trench to form oxygen-containing regions 90. Also, the p-type contact regions 32 are formed by the ion implantation method. Then, annealing is performed to activate the implanted ions.

Next, a gate insulating film 50 composed of silicon oxide and a gate electrode 60 composed of low-resistance polycrystalline silicon are formed in the gate trench. And, the interlayer insulating film 55 composed of silicon oxide is formed so as to cover the gate electrode 60. Further, contact holes reaching the source regions 40 and the contact regions 32 are formed in the interlayer insulating film 55, and the source electrode 70 connected to the source regions 40 and the contact regions 32 through the contact holes is formed on the interlayer insulating film 55. Further, the drain electrode 80 connected to the semiconductor substrate 10 is formed on the rear surface (second main surface) of the semiconductor substrate 10. Through the above steps, the SiC-MOSFET of Embodiment 3 illustrated in FIG. 14 is completed.

Figure 15:
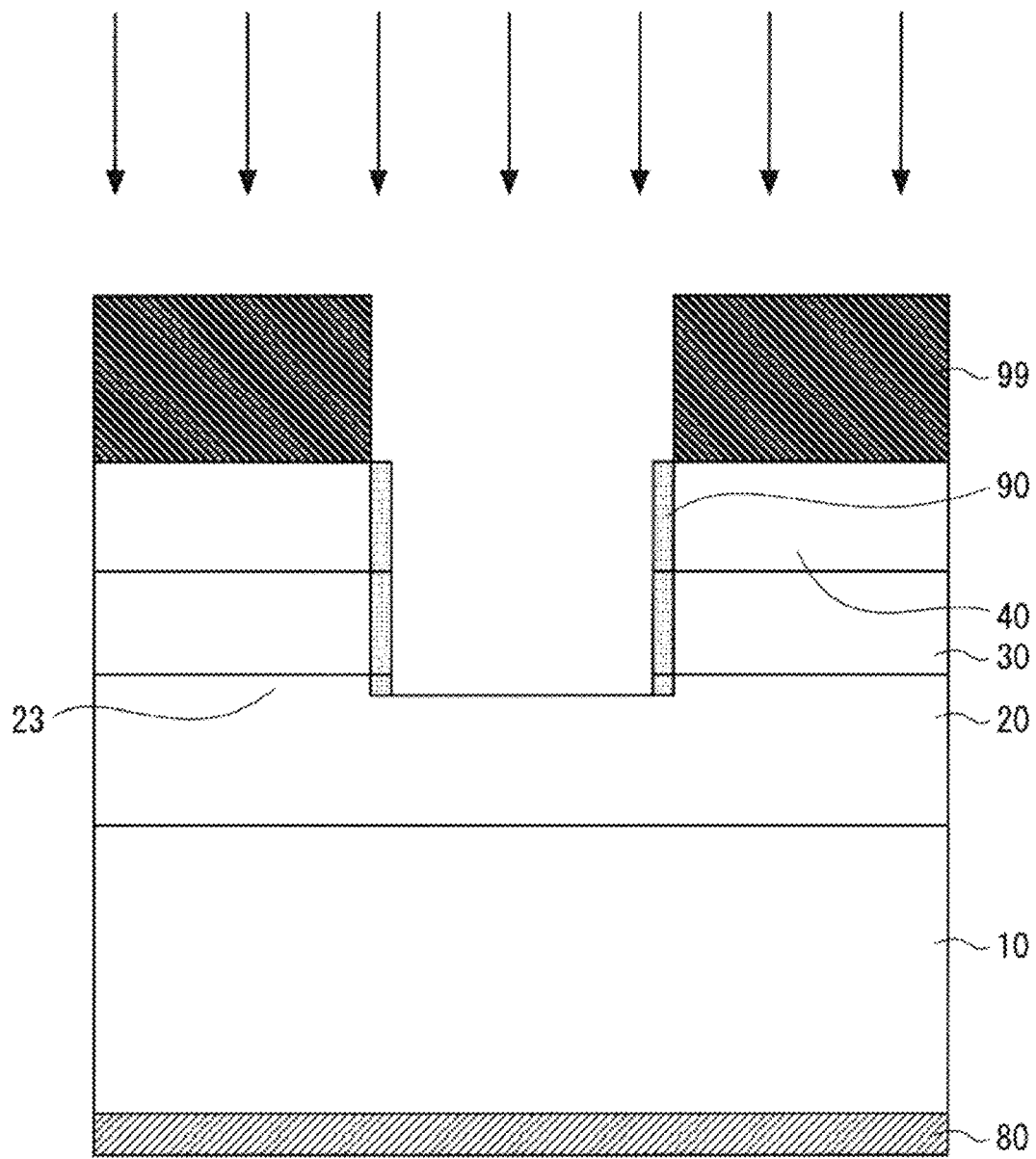
FIG. 15 A schematic cross-sectional view illustrating a manufacturing method of the silicon carbide semiconductor device according to Embodiment 3 of the present invention.

Here, a method of forming the oxygen-containing regions 90 on the side wall of the gate trench will be described. For example, as illustrated in FIG. 15, a photoresist 99 used as an etching mask when forming the gate trench is retracted after the formation of the gate trench, and then the photoresist 99 is used as an implantation mask to ion-implant oxygen from above the gate trench, and the oxygen-containing regions 90 can be formed on the side wall of the gate trench. The arrows in FIG. 15 schematically indicate the ions in ion implantation.

Figure 16:
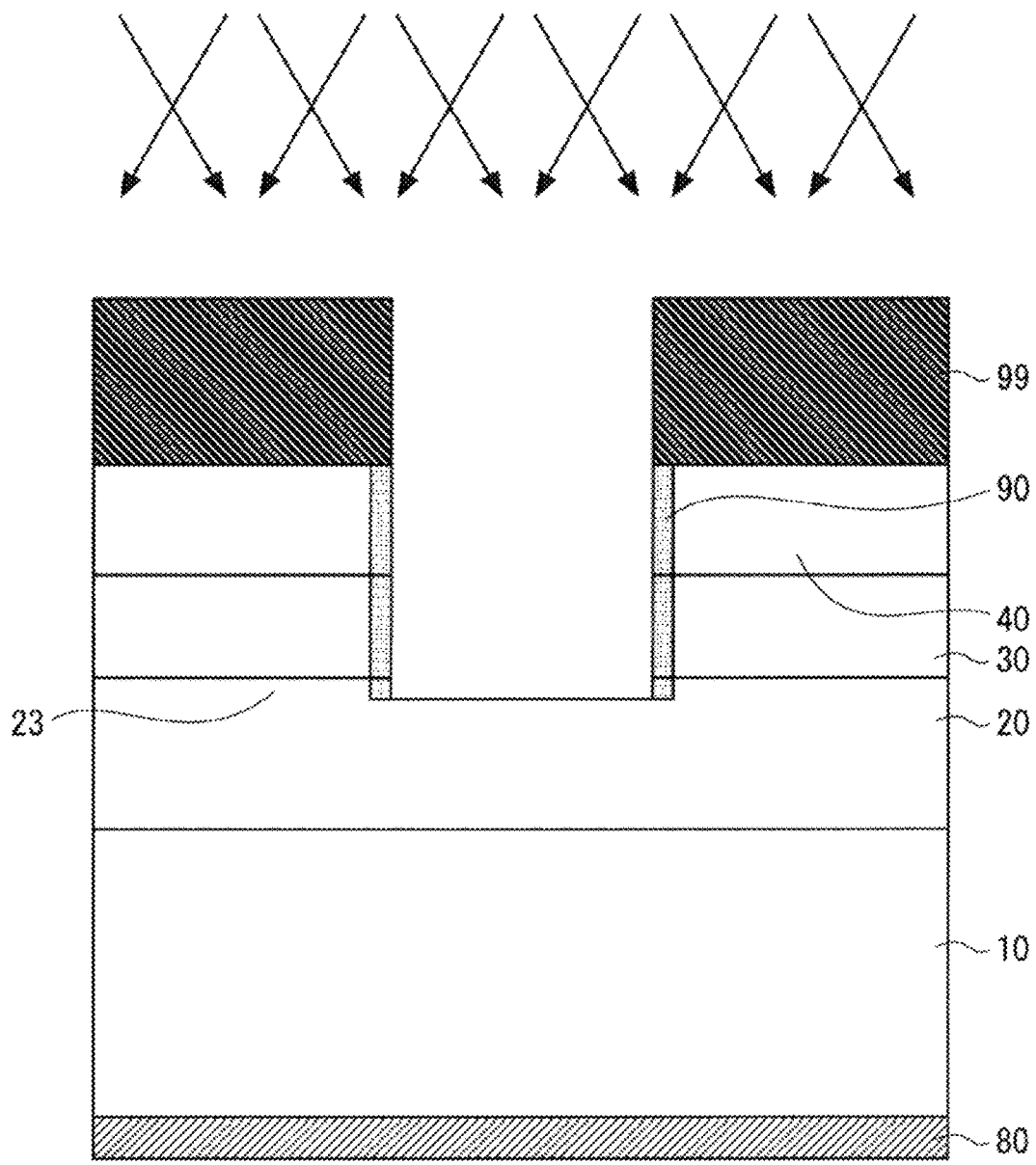
FIG. 16 A schematic cross-sectional view illustrating the manufacturing method of the silicon carbide semiconductor device according to Embodiment 3 of the present invention.

Also, as illustrated in FIG. 16, the photoresist 99 used as an etching mask when forming the gate trench is used as an implantation mask as it is, and oxygen is ion-implanted diagonally from above the gate trench, the oxygen-containing regions 90 can be formed on the side wall of the gate trench.

Figure 17:
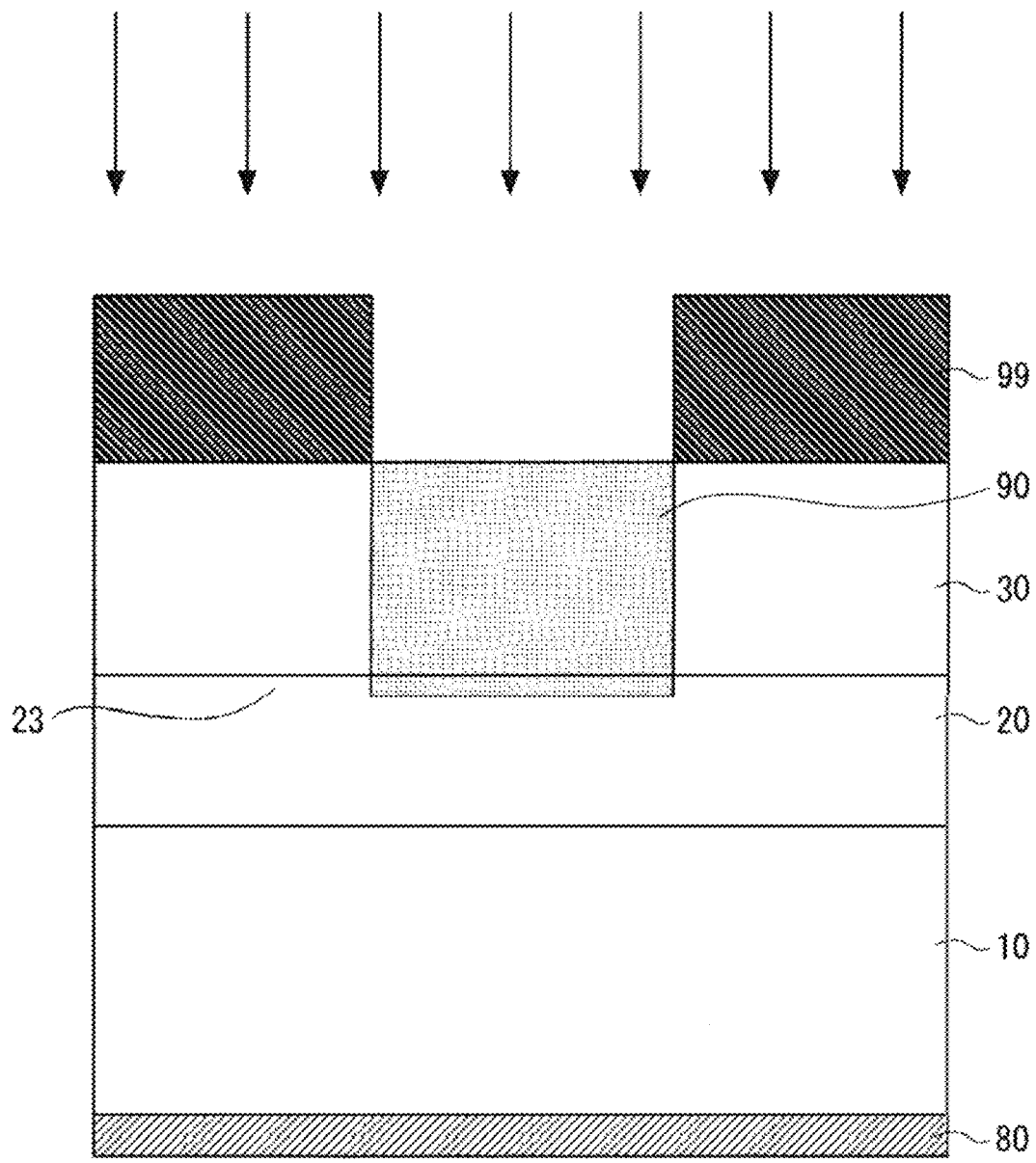
FIG. 17 A schematic cross-sectional view illustrating the manufacturing method of the silicon carbide semiconductor device according to Embodiment 3 of the present invention.

Alternatively, as illustrated in FIG. 17, a process may be adopted in which, before forming the gate trench, the oxygen-containing region 90 is formed by ion-implanting oxygen into the region of the silicon carbide layer including the gate trench formation region, then the gate trench is formed in the oxygen-containing region 90, at this point, the oxygen-containing regions 90 remain on the side walls of the gate trench.

In the SiC-MOSTET of Embodiment 3, the threshold voltage can be increased while lowering the channel resistance as in the SiC-MOSFET of Embodiment 1. Therefore, a SiC-MOSFET with low resistance and high reliability can be obtained.

Although in Embodiments 1 to 3, aluminum (Al) is used as the p-type impurities, the p-type impurities may be boron (B), gallium (Ga), indium (In), or the like. Further, the n-type impurities may be phosphorus (P) instead of nitrogen (N).

The gate insulating film 50 does not necessarily have to be an oxide film such as $SiO_2$, and may be an insulating film other than the oxide film, or a combination of an insulating film other than an oxide film and the oxide film. Further, the method for forming silicon oxide as the gate insulating film 50 is not limited to the thermal oxidation method, and silicon oxide may be formed by the CVD method or an atomic layer deposition (ALD) method. Further, the crystal structure of the semiconductor substrate 10, the plane orientation and off angle of the main surface, the implantation conditions for each ion implantation, and the like are not limited to the examples illustrated above.

Further, although in Embodiments 1 to 3, as the silicon carbide semiconductor device, a so-called vertical MOSFET in which the drain electrode 80 is formed on the rear surface of the semiconductor substrate 10 is illustrated, the silicon carbide semiconductor device may be a so-called horizontal MOSFET such as a RESURF MOSFET in which the drain electrode 80 is formed on the surface of the drift layer 20. Further, the silicon carbide semiconductor device is not limited to the MOSFET, and may be an insulated gate bipolar transistor (IGBT), or a MOSFET or an IGBT having a superjunction structure.

Embodiment 4

In Embodiment 4, the silicon carbide semiconductor device according to above-described Embodiments 1 to 3 is applied to a power conversion device. The application of the silicon carbide semiconductor device according to Embodiments 1 to 3 is not limited to the specific power conversion device. As Embodiment 4, a case where the silicon carbide semiconductor device according to Embodiments 1 to 3 is applied to the three-phase inverter will be described.

FIG. 18 is a block diagram illustrating a configuration a power conversion system to which the power conversion device according to Embodiment 4 is applied.

The power conversion system illustrated in FIG. 18 includes a power source 100, a power conversion device 200, and a load 300. The power source 100 is a DC power source, and supplies DC power to the power conversion device 200. The power source 100 can be configured with various elements, for example, it can be configured with a DC system, a solar cell, a storage battery, or it may be configured with a rectifier circuit or an AC/DC converter connected to an AC system. Further, the power source 100 may be configured by a DC/DC converter that converts the DC power output from the DC system into a predetermined power.

The power conversion device 200 is a three-phase inverter connected between the power source 100 and the load 300, converts the DC power supplied from the power source 100 into AC power, and supplies the AC power to the load 300. As illustrated in FIG. 18, the power conversion device 200 includes a main conversion circuit 201 that converts DC power into AC power and outputs the AC power, and a drive circuit 202 that outputs a drive signal that drives each switching element of the main conversion circuit 201, and a control circuit 203 that outputs a control signal for controlling the drive circuit 202 to the drive circuit 202.

The drive circuit 202 performs off-control by equalizing the voltage of the gate electrode and the voltage of the source electrode to the same potential in each normally-off type switching element.

The load 300 is a three-phase electric motor driven by AC power supplied from the power conversion device 200. The load 300 is not limited to a specific application, and is an electric motor mounted on various electric devices. For example, the load 300 is used as an electric motor for a hybrid vehicle, an electric vehicle, a railroad vehicle, an elevator, or an air conditioner.

Hereinafter, the details of the power conversion device 200 will be described below. The main conversion circuit 201 includes a switching element and a freewheeling diode (not illustrated), and when the switching element switches, the DC power supplied from the power source 100 is converted into AC power and supplied the AC power to the load 300. There are various specific circuit configurations of the main conversion circuit 201, and the main conversion circuit 201 according to Embodiment 4 adopts a two-level three-phase full bridge circuit which is configured with six switching elements and six freewheeling diodes each of which is connected in antiparallel to the respective switching elements. The silicon carbide semiconductor device according to any one of above Embodiments 1 to 3 is applied to each switching element of the main conversion circuit 201. The six switching elements are connected in series for each of the two switching elements to form an upper and lower arm, and each upper and lower arm constitutes each phase (U phase, V phase, W phase) of the full bridge circuit. Then, the output terminals of each upper and lower arm, that is, the three output terminals of the main conversion circuit 201 are connected to the load 300.

The drive circuit 202 generates a drive signal for driving the switching elements of the main conversion circuit 201, and supplies the drive signal to the control electrodes of the switching elements of the main conversion circuit 201. Specifically, the drive circuit 202 outputs a drive signal for turning on the switching elements and a drive signal for turning off the switching elements to the control electrode of each switching element in accordance with the control signal from the control circuit 203 described later. When the switching elements are kept on state, the drive signal is a voltage signal (on signal) equal to or higher than the threshold voltage of the switching elements, and when the switching elements are kept off state, the drive signal is a voltage signal (off signal) equal to or lower than the threshold voltage of the switching elements.

The control circuit 203 controls the switching elements of the main conversion circuit 201 so that the desired power is supplied to the load 300. Specifically, the control circuit 203 calculates the time (on time) for each switching element of the main conversion circuit 201 to be in the on state based on the power to be supplied to the load 300. For example, the main conversion circuit 201 can be controlled by PWM control that modulates the on time of the switching elements in accordance with the voltage to be output. Then, the control circuit 203 outputs a control command (control signal) to the drive circuit 202 so that an on signal is output to the switching elements that should be turned on and an off signal is output to the switching elements that should be turned off at each point. The drive circuit 202 outputs an on signal or an off signal as a drive signal to the control electrode of each switching element in accordance with the control signal.

In the power conversion device according to Embodiment 4, the silicon carbide semiconductor device according to Embodiments 1 to 3 is applied as the switching element of the main conversion circuit 201; therefore, the power conversion device with low loss and improved reliability in high-speed switching can be realized.

Although in Embodiment 4, an example has been described in which the silicon carbide semiconductor device according to Embodiments 1 to 3 is applied to the two-level three-phase inverter, the application of the silicon carbide semiconductor device according to Embodiments 1 to 3 is not limited thereto, the silicon carbide semiconductor device is applicable to various power conversion devices. Although in Embodiment 4, a two-level power conversion device is used, a three-level or multi-level power conversion device may be used, and when power is supplied to a single-phase load, the silicon carbide semiconductor device according to Embodiment 1 to 3 may be applied to a single-phase inverter. Further, when supplying power to a DC load or the like, the silicon carbide semiconductor device according to Embodiments 1 to 3 is also applicable to the DC/DC converter or the AC/DC converter.

Further, the power conversion device to which the silicon carbide semiconductor device according to Embodiments 1 to 3 is applied is not limited to the case where the above-mentioned load is an electric motor, and is applicable, for example, as a power supply device for an electric discharge machine, a laser machine, induction heating cooking device or a non-contact power supply system, and is further applicable as a power conditioner for a photovoltaic power generation system, a power storage system, or the like.

It should be noted that Embodiments of the present invention can be arbitrarily combined and can be appropriately modified or omitted without departing from the scope of the invention.

EXPLANATION OF REFERENCE SIGNS 10 semiconductor substrate, 20 drift layer, 21 epi-channel layer, 22-23 junction region, 30 well region, 32 contact region, 40 source region, 50 gate insulating film, interlayer insulating film, 60 gate electrode, 70 source electrode, 80 drain electrode, 90 oxygen-containing region, 99 photoresist, 100 power source, 200 power conversion apparatus, 201 main conversion circuit, 202 driver circuit, 203 control circuit, 300 load.

The invention claimed is:

1. A silicon carbide semiconductor device comprising:
a semiconductor substrate composed of silicon carbide;
a drift layer composed of n-type silicon carbide formed on the semiconductor substrate;
a well region of p-type formed on a surface portion of the drift layer;
a source region of n-type formed on a surface portion of the well region and formed separated from the drift layer;
a gate insulating film formed so as to be in contact with the source region, the well region, and the drift layer;
a gate electrode formed so as to be opposite the well region via the gate insulating film; and
a source electrode connected to the source region, wherein
oxygen is contained in a region having a predetermined thickness from an interface between the well region and the gate insulating film toward the well regions side, and
in a region 30 nm or more away from the interface between the well region and the gate insulating film toward the well region side, a region in which the oxygen concentration is higher than a n-type impurity concentration in the drift layer is present.

2. The silicon carbide semiconductor device according to claim 1, wherein
an oxygen concentration peak in the region containing oxygen is within the well region.

3. The silicon carbide semiconductor device according to claim 1, wherein
an oxygen concentration is $1 \times 10^{18}$ cm$^{-3}$ or more in a region with a thickness of 15 nm from the interface between the well region and the gate insulating film toward the well region side.

4. The silicon carbide semiconductor device according to claim 1, wherein
a total dose amount of oxygen contained in the well region is $1 \times 10^{11}$ cm$^{-3}$ or more and $1 \times 10^{17}$ cm$^{-3}$ or less.

5. The silicon carbide semiconductor device according to claim 1, wherein
in a region 30 nm or more away from the interface between the well region and the gate insulating film toward the well region side, a region in which the oxygen concentration is higher than a p-type impurity concentration in the well region is present.

6. The silicon carbide semiconductor device according to claim 1, wherein
a peak value of the oxygen concentration within the well region is $1 \times 10^{17}$ cm$^{-3}$ or more and $2 \times 10^{21}$ cm$^{-3}$ or less.

7. The silicon carbide semiconductor device according to claim 1, wherein
the gate electrode is arranged directly above the well region containing oxygen.

8. The silicon carbide semiconductor device according to claim 1, wherein
the gate electrode is formed in a trench adjacent to the source region and the well region and reaching the drift layer, and is opposite the well region containing oxygen via the gate insulating film.

9. A power conversion device comprising
a silicon carbide semiconductor device according to claim 1, wherein the power conversion device includes
a main conversion circuit configured to convert power input and output thereof,
a drive circuit configured to output a drive signal for driving the silicon carbide semiconductor device to the silicon carbide semiconductor device, and
a control circuit configured to output a control signal for controlling the drive circuit to the drive circuit.

10. The power conversion device according to claim 9, wherein
the drive circuit is configured to output the drive signal which equalizes a voltage of the gate electrode and a voltage of the source electrode when the silicon carbide semiconductor device is off.

* * * * *